United States Patent
Meyer et al.

(10) Patent No.: US 9,064,883 B2
(45) Date of Patent: Jun. 23, 2015

(54) CHIP WITH ENCAPSULATED SIDES AND EXPOSED SURFACE

(75) Inventors: Thorsten Meyer, Regensburg (DE); Klaus Reingruber, Singapore (SG); David O'Sullivan, Sinzing (DE)

(73) Assignee: Intel Mobile Communications GmbH, Neubiberg (DE)

( * ) Notice: Subject to any disclaimer, the term of this patent is extended or adjusted under 35 U.S.C. 154(b) by 97 days.

(21) Appl. No.: 13/218,265

(22) Filed: Aug. 25, 2011

(65) Prior Publication Data
US 2013/0049205 A1    Feb. 28, 2013

(51) Int. Cl.
*H01L 23/48* (2006.01)
*H01L 21/56* (2006.01)
*H01L 23/31* (2006.01)
*H01L 23/00* (2006.01)

(52) U.S. Cl.
CPC .......... *H01L 21/568* (2013.01); *H01L 23/3185* (2013.01); *H01L 23/3157* (2013.01); *H01L 23/3121* (2013.01); *H01L 23/3107* (2013.01); *H01L 21/56* (2013.01); *H01L 21/561* (2013.01); *H01L 24/19* (2013.01); *H01L 24/96* (2013.01); *H01L 2924/01029* (2013.01); *H01L 2224/73267* (2013.01); *H01L 24/20* (2013.01); *H01L 2224/12105* (2013.01); *H01L 2924/1461* (2013.01)

(58) Field of Classification Search
CPC ......... H01L 24/20; H01L 24/19; H01L 24/96; H01L 23/3107; H01L 23/3185; H01L 23/3157; H01L 23/3121

USPC .......................... 257/730, 773, 787; 438/127
See application file for complete search history.

(56) References Cited

U.S. PATENT DOCUMENTS

| | | | |
|---|---|---|---|
| 2002/0031867 A1 | 3/2002 | Horiuchi et al. | |
| 2005/0200028 A1 | 9/2005 | Farnworth et al. | |
| 2009/0160053 A1* | 6/2009 | Meyer et al. | 257/738 |
| 2010/0193931 A1* | 8/2010 | Do et al. | 257/686 |
| 2011/0049731 A1* | 3/2011 | Dershem et al. | 257/792 |
| 2011/0133341 A1* | 6/2011 | Shimizu et al. | 257/773 |
| 2011/0143498 A1 | 6/2011 | Huang et al. | |
| 2011/0272800 A1* | 11/2011 | Chino | 257/737 |

FOREIGN PATENT DOCUMENTS

| | | |
|---|---|---|
| CN | 1499590 A | 5/2004 |
| CN | 101393873 A | 3/2009 |
| CN | 101685784 A | 3/2010 |

(Continued)

OTHER PUBLICATIONS

Office Action Dated Jun. 13, 2014 Korean Patent Application No. 2012-0092292.
First Office Action Dated Aug. 27, 2014 Chinese Patent Application No. 201210304404.0.

*Primary Examiner* — Kevin Parendo
(74) *Attorney, Agent, or Firm* — Eschweiler & Associates, LLC

(57) ABSTRACT

A method of manufacturing a device includes providing a semiconductor chip having a first face and a second face opposite to the first face with a contact pad arranged on the first face. The semiconductor chip is placed on a carrier with the first face facing the carrier. The semiconductor chip is encapsulated with an encapsulation material. The carrier is removed and the semiconductor material is removed from the second face of the first semiconductor chip without removing encapsulation material at the same time.

7 Claims, 11 Drawing Sheets

(56) References Cited

FOREIGN PATENT DOCUMENTS

| | | |
|---|---|---|
| CN | 102082102 A | 6/2011 |
| EP | 1354351 A2 | 10/2003 |
| JP | 2001339011 A | 12/2001 |
| KR | 20070058521 A | 6/2007 |

\* cited by examiner

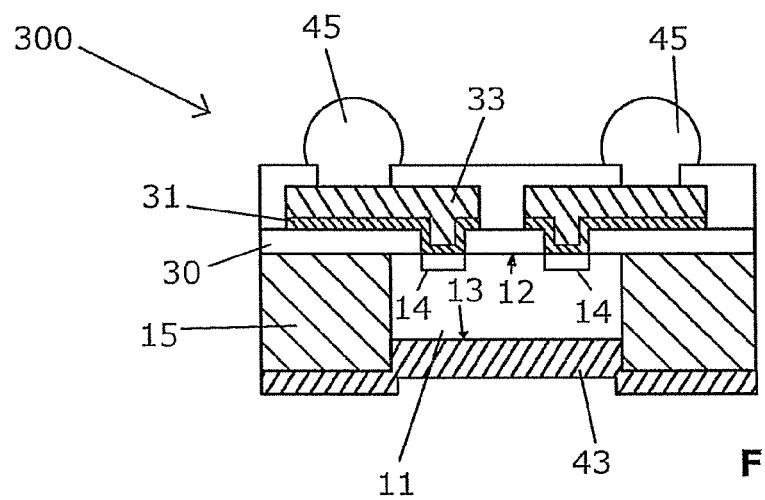
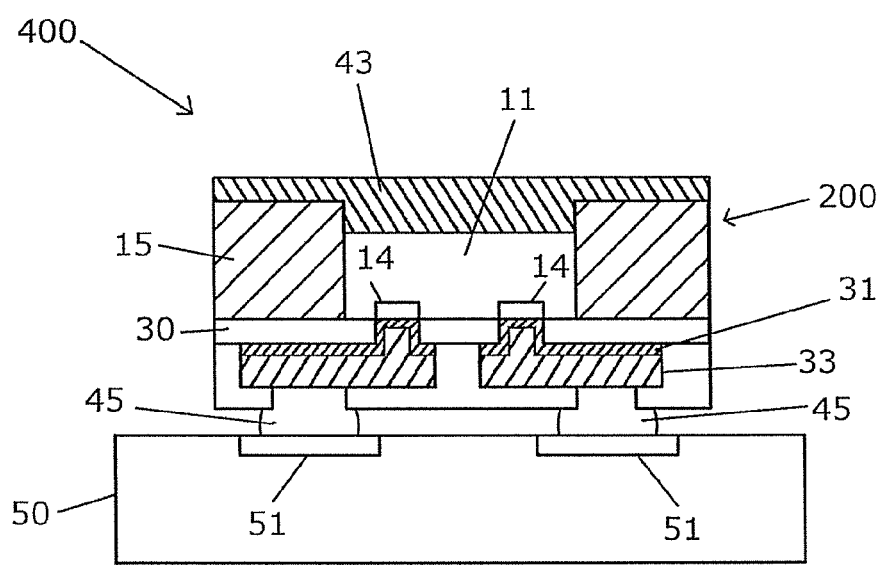

CHIP WITH ENCAPSULATED SIDES AND EXPOSED SURFACE

TECHNICAL FIELD

This invention relates to a semiconductor device and a method of manufacturing a semiconductor device, wherein the method includes one or more grinding steps.

BACKGROUND

Wafer level packaging is gaining interest throughout the semiconductor industry due to advantages in cost and performance. When standard wafer level package technologies are used, all technology process steps are performed at the wafer level. Since standard wafer level packages are fan-in solutions, only a limited number of contact pads under the semiconductor chip is possible. Thus, for the placement of a large number of contact pads the semiconductor chip may be designed bigger or an additional material may be placed as a space holder around the die to bear the wiring that allows fan-out redistribution.

Wafer level packaging usually involves grinding steps to reduce the thickness of the semiconductor die. Any grinded semiconductor surface contains, however, a system of cracks, ridges and valleys. These damages in the semiconductor material may induce cracks through the semiconductor bulk material if additional mechanical stress is applied. Such mechanical stress may occur during processing, handling or shipment of the semiconductor devices or during the use in an application, such as a mobile phone.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3 schematically illustrates a cross-sectional view of one embodiment of a device including a semiconductor chip encapsulated with an encapsulation material;

FIG. 4 schematically illustrates a cross-sectional view of one embodiment of a system including a semiconductor device mounted on a circuit board.

DETAILED DESCRIPTION OF ILLUSTRATIVE EMBODIMENTS

Figure 1A:
FIGS. 1A-1H schematically illustrate a cross-sectional view of one embodiment of a method of manufacturing a device including placing a semiconductor chip on a carrier, covering the semiconductor chip with an encapsulation material, removing the carrier, grinding the semiconductor chip and the encapsulation material, forming a redistribution layer, further grinding the semiconductor chip and the encapsulation material and reducing the thickness of the semiconductor chip.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing semiconductor chips are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones etc. Semiconductor chips in which such functional elements are embedded generally contain electronic circuits which serve for driving the functional elements or further process signals generated by the functional elements. The semiconductor chips need not be manufactured from specific semiconductor material, for example, Si, SiC, SiGe, GaAs, and, furthermore, may contain inorganic and/or organic materials that are not semiconductors, such as, for example, discrete passives, antennas, insulators, plastics or metals.

The semiconductor chips may have contact pads (or electrodes or contact elements) which allow electrical contact to be made with the integrated circuits included in the semiconductor chips. The contact pads may include one or more metal layers which are applied to the semiconductor material of the semiconductor chips. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main faces of the semiconductor chips or on other faces of the semiconductor chips.

One or more metal layers having the shape of conductor lines (or conductor tracks) may be provided and may be electrically coupled to the semiconductor chips. The metal layers may, for example, be used to produce a redistribution layer. The conductor lines may be employed as wiring layers to make electrical contact with the semiconductor chips from outside the device and/or to make electrical contact with other semiconductor chips and/or components contained in the device. The conductor lines may couple the contact pads of the semiconductor chips to the external contact pads. The conductor lines may be manufactured with any desired geometric shape and any desired material composition. Any desired metal, for example, aluminum, nickel, palladium, silver, tin, gold or copper, or metal alloys may be used as the material. The conductor lines need not be homogenous or manufactured from just one material, that is to say various compositions and concentrations of the materials contained in the conductor lines are possible. Furthermore, the conductor lines may be arranged above or below or between electrically insulating layers.

The devices described below include external contact pads (or external contact elements), which may be of any shape and size. The external contact pads may be accessible from outside the devices and may thus allow electrical contact to be made with the semiconductor chips from outside the devices. Furthermore, the external contact pads may be thermally conductive and may serve as heat sinks for dissipating the heat generated by the semiconductor chips. The external contact pads may be composed of any desired electrically conductive material or stack of different materials, for example, of a metal, such as copper, nickel, aluminum or gold, a metal alloy or an electrically conductive organic material. The external contact pads may be formed by portions of the metal layers. Solder material, such as solder balls or solder bumps, may be deposited on the external contact pads.

The semiconductor chips or at least parts of the semiconductor chips may be covered with an encapsulation material, which may be electrically insulating and which may form an encapsulation body. The encapsulation material may be any appropriate duroplastic, thermoplastic or thermosetting material or laminate (prepreg) and may contain filler materials. Various techniques may be employed to encapsulate the semiconductor chips with the encapsulation material, for example, compression molding, injection molding, powder molding, liquid molding, lamination or printing. Heat and/or pressure may be used to apply the encapsulation material.

The encapsulation material may be used to produce fan-out type packages. In a fan-out type package at least some of the external contact pads and/or conductor lines connecting the semiconductor chip to the external contact pads are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

Figure 1B:
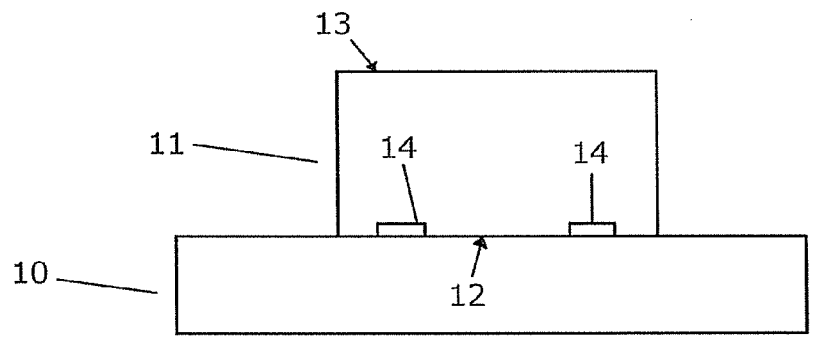
Figure 1C:
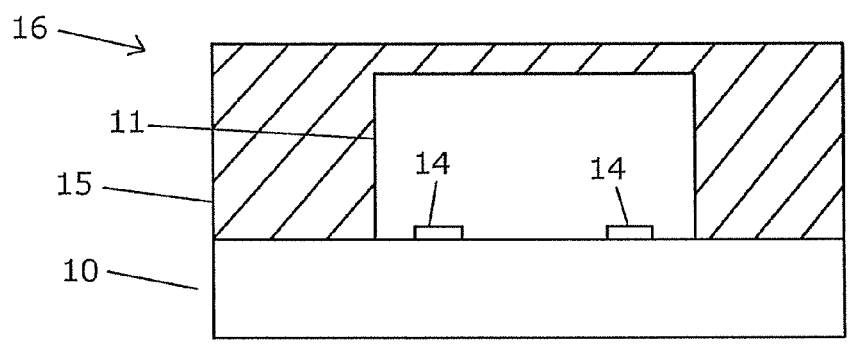
Figure 1D:
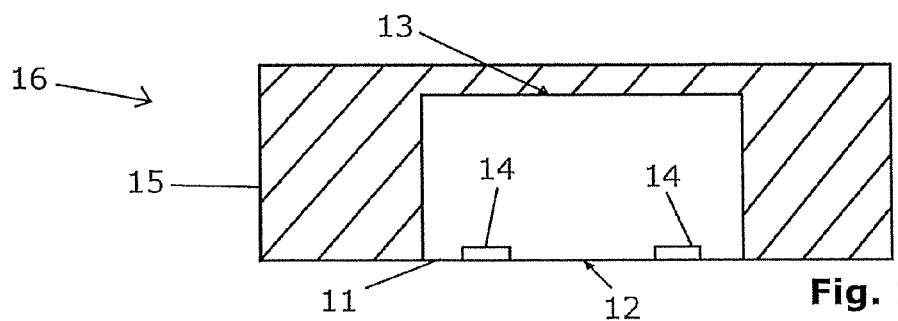
Figure 1E:
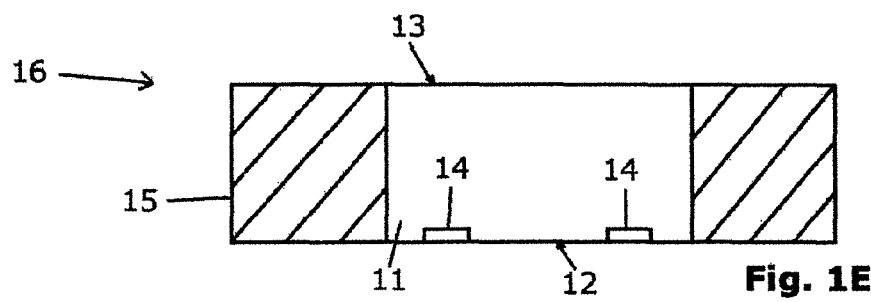
Figure 1F:
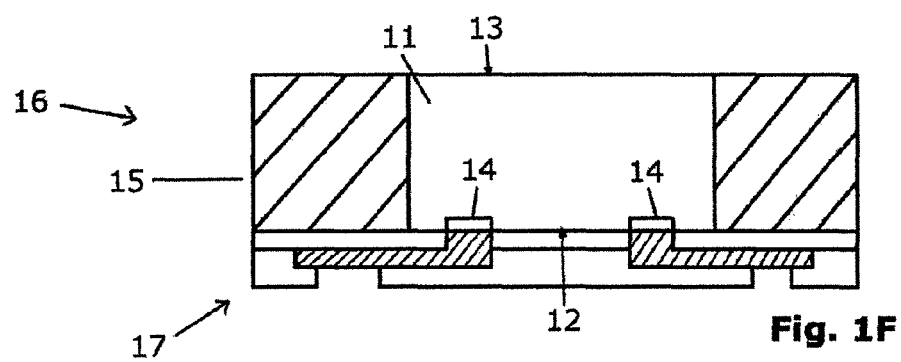
Figure 1G:
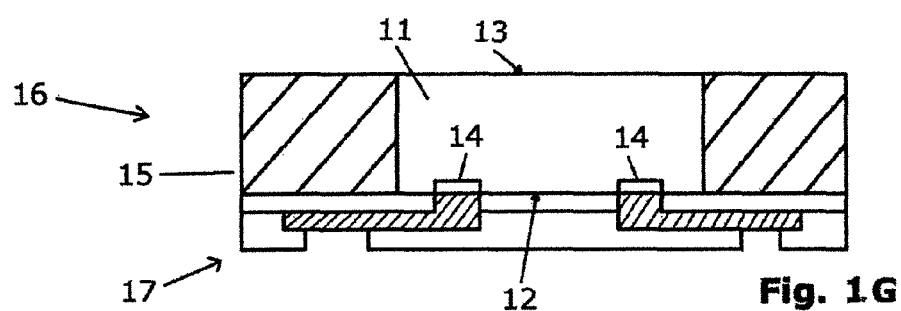
Figure 1H:
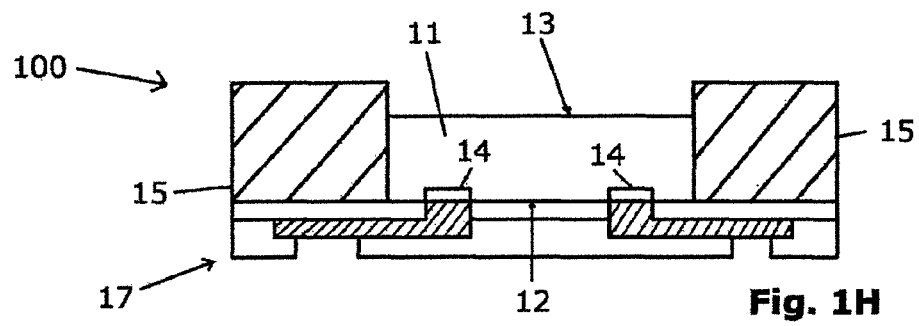

FIGS. 1A-1H schematically illustrate a method of manufacturing a device 100. A cross section of the device 100 obtained by the method is shown in FIG. 1H.

FIG. 1A schematically illustrates a carrier 10.

FIG. 1B schematically illustrates a first semiconductor chip 11 placed on the carrier 10. The first semiconductor chip 11 has a first face 12 and a second face 13 opposite to the first face 12. Contact pads 14 are arranged on the first face side 12 of the semiconductor chip 11. The semiconductor chip 11 is placed on the carrier 10 with its first face 12 facing the carrier 10.

FIG. 1C schematically illustrates an encapsulation material 15 encapsulating the first semiconductor chip 11 to form an encapsulation body 16.

FIG. 1D schematically illustrates that the carrier 10 is removed from the encapsulation body 16.

FIG. 1E schematically illustrates a first grinding step where the encapsulation body 16 and the first semiconductor chip 11 are thinned by removing material from the encapsulation body 16 and the second face 13 of the first semiconductor chip 11.

FIG. 1F schematically illustrates a redistribution layer 17 which is formed on the first face 12 of the first semiconductor chip 11 and the encapsulation material 15 surrounding the first semiconductor chip 11.

FIG. 1G schematically illustrates a second grinding step where the encapsulation body 16 and the second face 13 of the first semiconductor chip 11 are again grinded.

FIG. 1H schematically illustrates that semiconductor material is removed from the second face 13 of the first semiconductor chip 11 without substantially removing encapsulation material 15 at the same time.

Figure 2A:
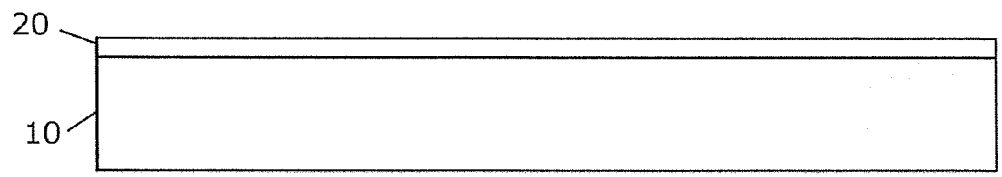
FIGS. 2A-2P schematically illustrate a cross-sectional view of one embodiment of a method of manufacturing a device including producing a fan-out type package of a semiconductor chip, grinding the package twice and producing a step between the package and the semiconductor chip.
Figure 2B:
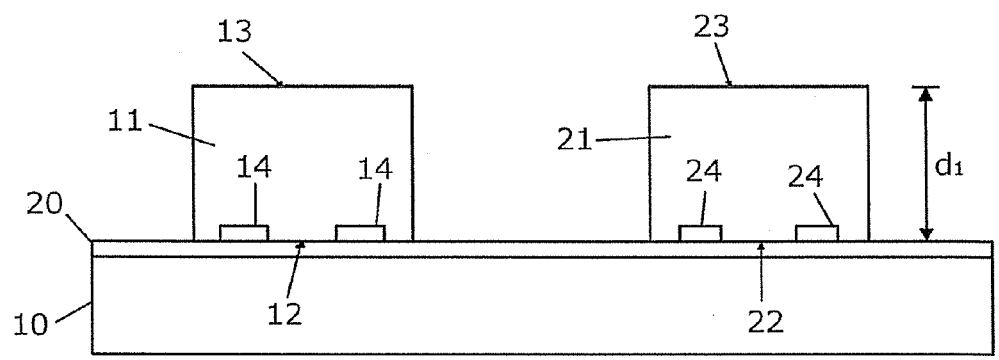
Figure 2C:
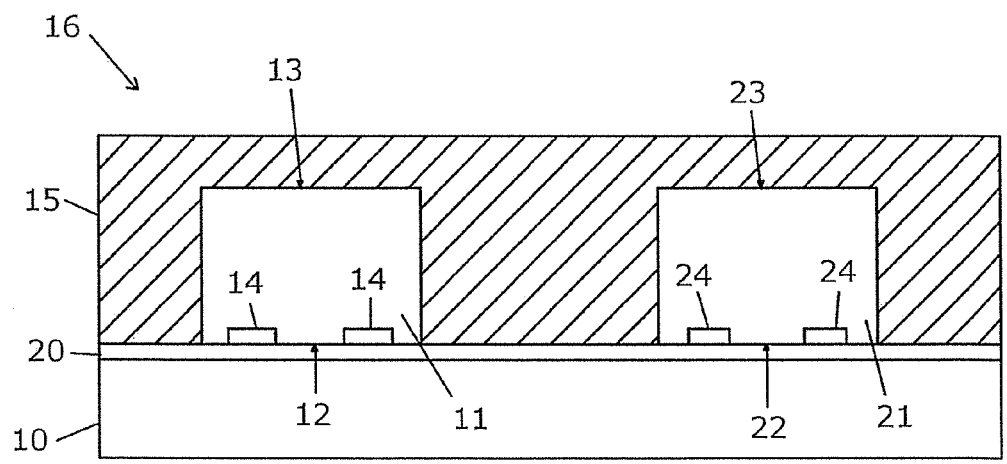
Figure 2D:
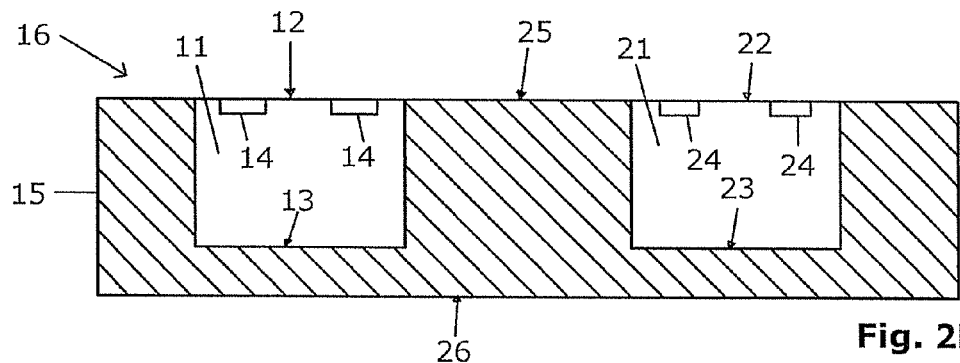
Figure 2E:
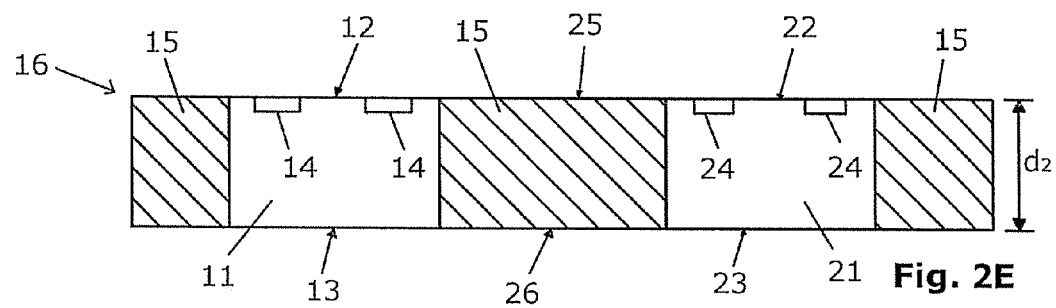
Figure 2F:
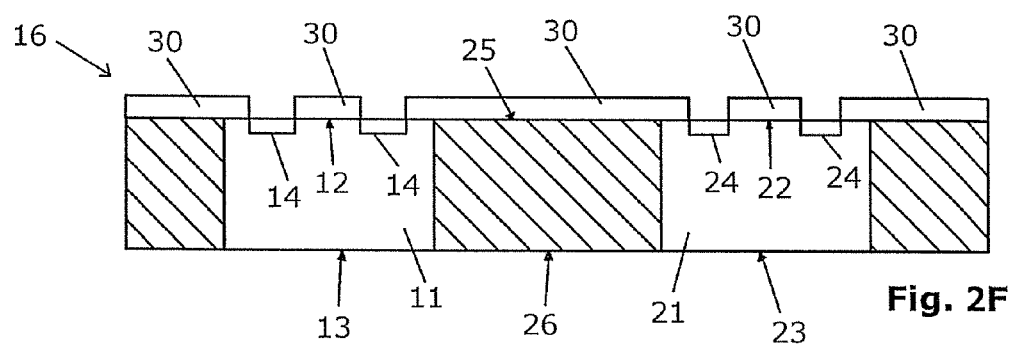
Figure 2G:
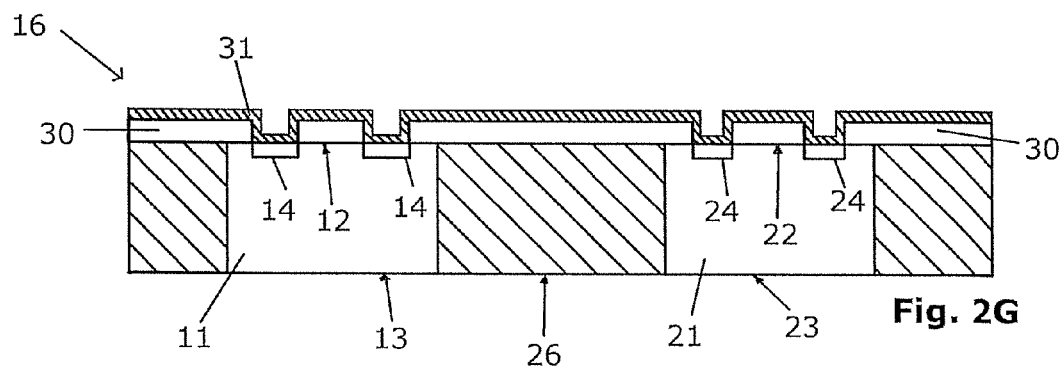
Figure 2H:
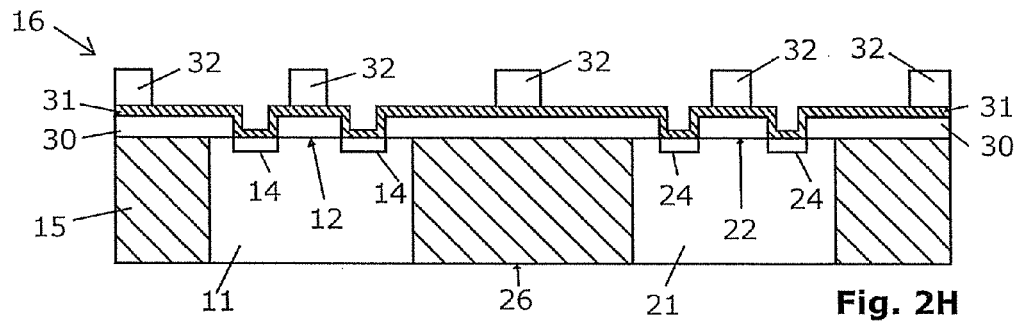
Figure 2I:
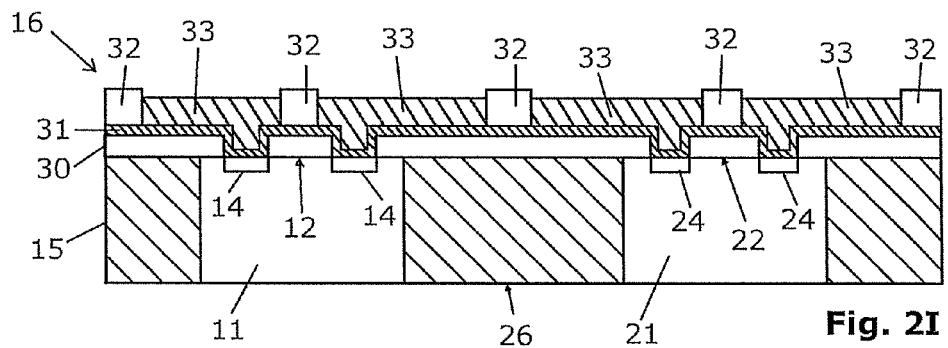
Figure 2J:
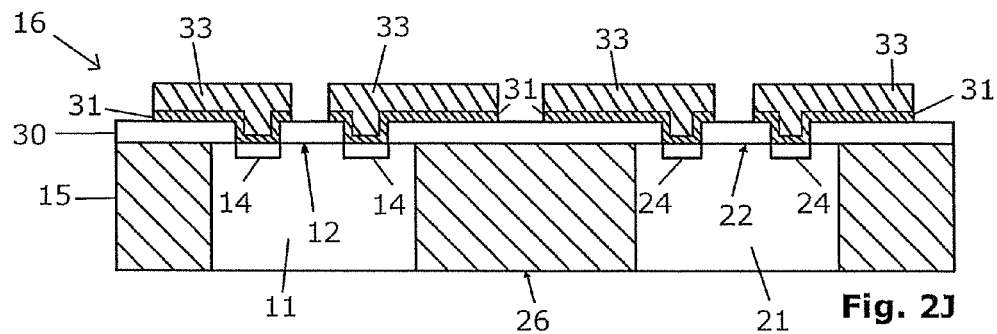
Figure 2K:
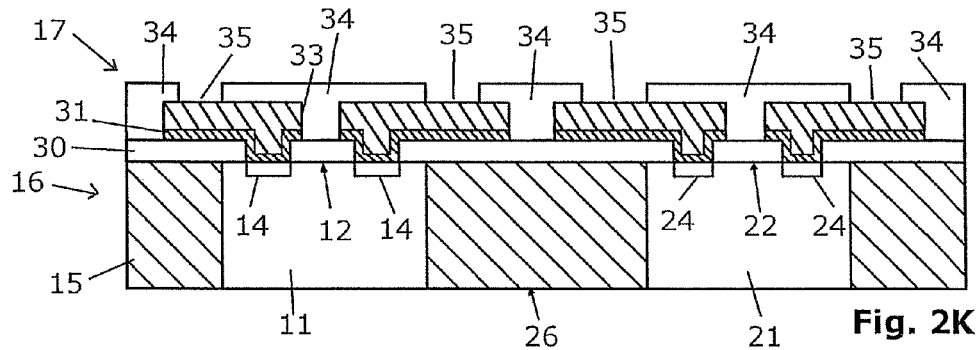
Figure 2L:
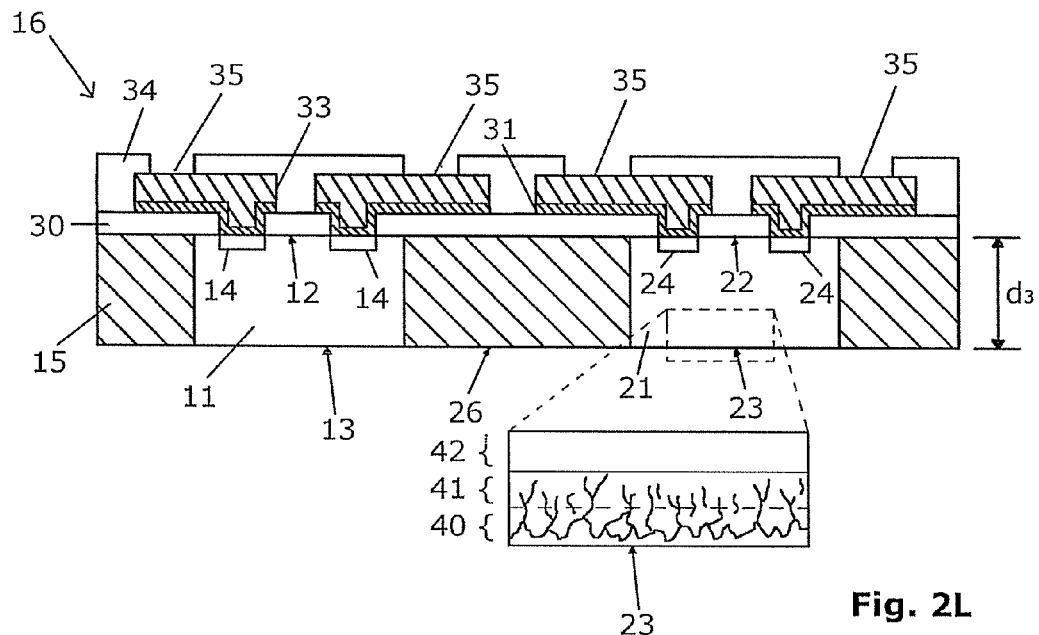
Figure 2M:
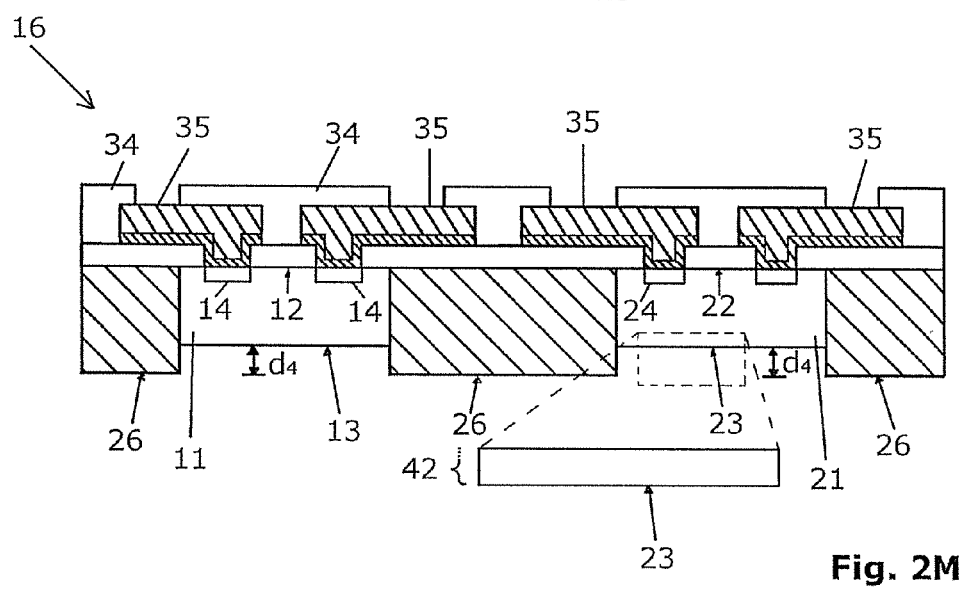
Figure 2N:
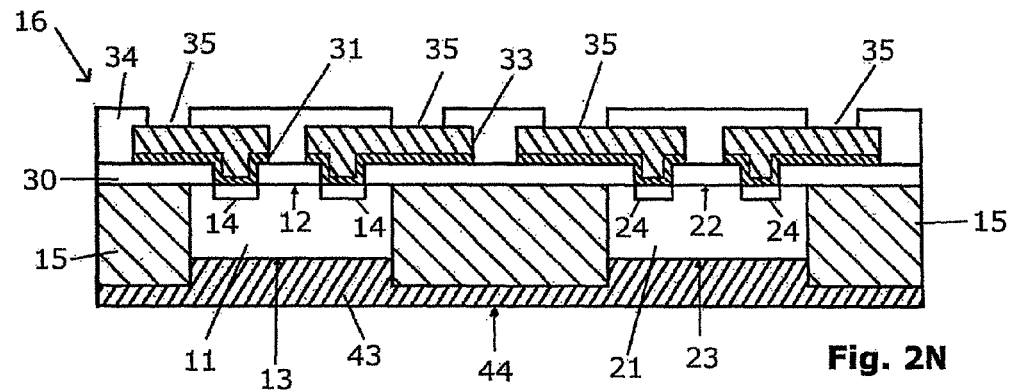
Figure 2O:
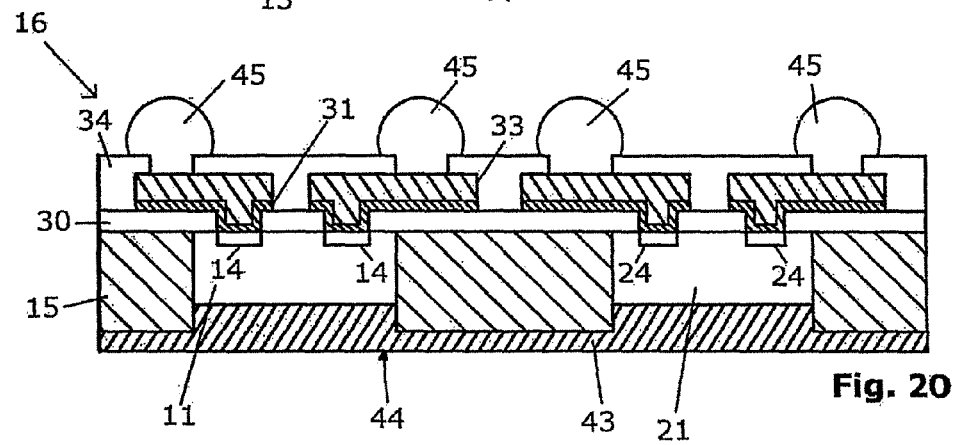
Figure 2P:
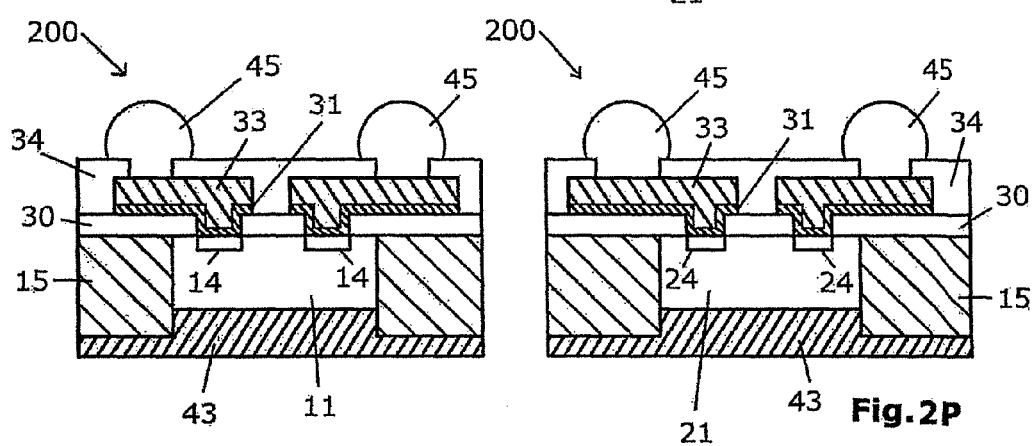

FIGS. 2A-2P schematically illustrate a method for manufacturing a device 200, a cross section of which is shown in FIG. 2P. The method shown in FIGS. 2A-2P is an implementation of the method shown in FIGS. 1A-1H. The details of the production method that are described below can therefore be likewise applied to the method of FIGS. 1A-1H.

FIG. 2A schematically illustrates a carrier 10 that may be a plate made of a rigid material, for example, a metal, such as nickel, steel or stainless steel, laminate, film or a material stack. The carrier 10 may have at least one flat face on which components of the device 200 can be placed. The shape of the carrier 10 is not limited to any geometric shape, for example, the carrier 10 may be round or square-shaped. The carrier 10 may have any appropriate size.

An adhesive tape 20, for example, a double sided sticky tape, may be laminated onto the carrier 10. The function of the adhesive tape 20 is to provide a releasable fixation of the components placed on the carrier 10 during the subsequent processing steps. Instead of the adhesive tape 20 any other suitable means may be employed which serves the same function. For this purpose, the carrier 10 may have a certain coating, for example, a gold or teflon coating which allows to release the carrier 10 from the components which are placed on the carrier 10.

FIG. 2B schematically illustrates a first semiconductor chip 11 and a second semiconductor chip 21, which are placed on the top face of the adhesive tape 20. The first semiconductor chip 11 has a first face 12 and a second face 13 opposite to the first face 12. Contact pads 14 are arranged on the first face 12. The second semiconductor chip 21 has a first face 22 and a second face 23 opposite to the first face 22. Contact pads 24 are arranged on the first face 22. The first faces 12, 22 of both semiconductor chips 11, 21 face the carrier 10. In one embodiment, the semiconductor chips 11,

21 have a thickness $d_1$ of around 725 or 775 μm, but other thicknesses $d_1$ are also possible.

Although only two semiconductor chips 11, 21 are shown in FIG. 2B, any number of semiconductor chips may be placed on the carrier 10, for example, more than 50 or 500 or 1000 semiconductor chips. The semiconductor chips may, for example, be arranged in an array. The semiconductor chips are relocated on the carrier 10 typically in larger spacing as they have been in the wafer bond. The semiconductor chips may have been manufactured on the same semiconductor wafer, but may alternatively have been manufactured on different semiconductor wafers. Furthermore, the semiconductor chips may be physically identical, but may also contain different integrated circuits and/or represent other components.

FIG. 2C schematically illustrates an encapsulation material 15 which is used to encapsulate the semiconductor chips 11, 21 and to form an encapsulation body 16. The encapsulation material 15 covers the second faces 13, 23 and all side faces of the semiconductor chips 11, 21. In one embodiment, the encapsulation material 15 is a duroplastic or thermosetting mold material. In this case, the encapsulation material 15 may be based on an epoxy material and may contain a filling material consisting of small particles of glass ($SiO_2$) or other electrically insulating mineral filler materials like $Al_2O_3$ or organic filler materials. The encapsulation material 15 may, for example, be applied by compression molding, injection molding, granulate molding, powder molding or liquid molding.

In one embodiment, the encapsulation material 15 is a sheet made of an electrically insulating polymer material. The polymer material may, for example, be a prepreg (short for preimpregnated fibers) that is a combination of a fiber mat, for example, glass or carbon fibers, and a resin, for example, a duroplastic material. Prepreg materials are usually used to manufacture PCBs (printed circuit boards). Well known prepreg materials that are used in PCB industry and that can be used here as the polymer material are: FR-2, FR-3, FR-4, FR-5, FR-6, G-10, CEM-1, CEM-2, CEM-3, CEM-4 and CEM-5. In one embodiment, the encapsulation material 15 is homogenous and made entirely of the same material. Thus, in this embodiment, the encapsulation material 15 includes exactly one layer and is not made in a layer-by-layer fashion.

FIG. 2D schematically illustrates that the encapsulation body 16 is released from the carrier 10. For this purpose, the adhesive tape 20 may feature thermo-release properties, which allow the removal of the adhesive tape 20 and the carrier 10 during a heat-treatment. The removal of the adhesive tape 20 and the carrier 10 from the encapsulation body 16 is carried out at an appropriate temperature, which depends on the thermo-release properties of the adhesive tape 20 and is usually higher than 150° C. After the removal of the carrier 10 and the adhesive tape 20 the first faces 12, 22 of the semiconductor chips 11, 21 define a substantially planar surface 25 together with a first face of the encapsulation material 15. The encapsulation material 15 has a second face 26 opposite to the planar surface 25.

FIG. 2E schematically illustrates that the encapsulation body 16 is thinned, for example, by grinding the second face 26 of the encapsulation material 15. In one embodiment, the encapsulation body 16 has a thickness $d_2$ of around 690 μm after the grinding, but other thicknesses $d_2$ are also possible. During the grinding process, the encapsulation material 15 covering the second faces 13, 23 of the semiconductor chips 11, 21 is removed. In addition, the semiconductor chips 11, 21 are also thinned by removing semiconductor material from their second faces 13, 23.

FIG. 2F schematically illustrates a dielectric layer 30 which is deposited on the planar surface 25 thereby covering the first faces 12, 22 of the semiconductor chips 11, 21 and the top surface of the encapsulation material 15 at least partially. The dielectric layer 30 has through holes which expose the contact pads 14, 24 of the semiconductor chips 11, 21. The dielectric layer 30 may be fabricated in various ways. For example, the dielectric layer 30 may be deposited from a gas phase or from a solution, or can be printed or laminated on the surface 25. Furthermore, thin-film technology methods like spin coating or a standard PCB industry process flow can be used for the application of the dielectric layer 30. The dielectric layer 30 may be fabricated from a polymer, such as polyimide, PBO, parylene, photoresist material, imide, epoxy, epoxy resin, duroplast, silicone, silicon nitride or an inorganic, ceramic-like material, such as silicone-carbon compounds. The thickness of the dielectric layer 30 may be up to 10 μm or even higher. In one embodiment, the deposition of the dielectric layer 30 is omitted.

FIG. 2G schematically illustrates a thin seed layer 31, which is deposited onto the dielectric layer 30 and the contact pads 14, 24. The deposition of the seed layer 31 may, for example, be carried out by sputtering or electroless deposition from a solution. The material of the seed layer 31 may be titanium, titanium tungsten, copper, palladium or any other appropriate metal, metal stack or metal alloy.

FIG. 2H schematically illustrates a plating resist 32. The plating resist 32 may be a photoresist layer and may be printed, electro-deposited or spin-coated on the top surface of the seed layer 31. By exposure to light having a suitable wavelength through a mask and subsequent development or laser application or laser direct imaging, recesses are formed in the plating resist 32.

FIG. 2I schematically illustrates a metal layer 33 which is galvanically grown and reinforces the portions of the seed layer 31, which are exposed by the recesses in the plating resist 32. Copper or other metals or metal alloys may be used as the material for the metal layer 33. During the galvanic deposition of the metal material, the seed layer 31 may be employed as an electrode. The metal layer 33 has a thickness of more than 3 μm.

FIG. 2J schematically illustrates that after the plating of the metal layer 33 the plating resist 32 is stripped away by using an appropriate solvent. The now exposed portions of the seed layer 31, which have not been covered with the metal layer 33, are removed by a brief etching step thereby creating a structured metal layer as illustrated in FIG. 2J.

FIG. 2K schematically illustrates a dielectric layer 34 that is deposited on top of the metal layer 33 and is opened in certain areas to expose portions of the metal layer 33. The exposed portions of the metal layer 33 serve as external contact pads 35. The dielectric layer 34 may be produced by using the same or similar materials and processing steps as described above in connection with the dielectric layer 30. The dielectric layer 34 has the function of a solder stop layer. The seed layer 31 and the metal layer 33 together with the dielectric layers 30, 34 form a redistribution layer 17. In one embodiment, the deposition of the dielectric layer 34 is omitted.

FIG. 2L schematically illustrates that the encapsulation body 16 is thinned again by grinding the second face 26 of the encapsulation material 15. During the grinding process, encapsulation material 15 and semiconductor material of the semiconductor chips 11, 21 are removed at the same time. The thickness $d_3$ of the semiconductor chips 11, 21 (and the encapsulation material 15) after the grinding depends on the requirements of the application that the devices 200 are designed for. In one embodiment, the thickness $d_3$ of the semiconductor chips 11, 21 is around 450 µm after the grinding, but other thicknesses $d_3$ are also possible. In one embodiment, the grinding step illustrated in FIG. 2L is omitted.

FIG. 2L also illustrates a portion of the second semiconductor chip 21 in an enlarged view. This illustration shows that the grinded semiconductor surface of the semiconductor chips 11, 21 contains a system of cracks, ridges and valleys. The peaks and valleys form a relief layer 40. Underlying the relief layer 40 is a damaged layer 41 characterized by microcracks, dislocations, slip and stress. Both of the layers 40 and 41 may induce cracks through the bulk semiconductor material 42 if additional stress is applied, for example, during processing, handling or shipment of the devices 200 or during the use in an application, such as a mobile phone.

FIG. 2M schematically illustrates that the relief layer 40 and the damaged layer 41 are removed from the semiconductor chips 11, 21. This is done in a polishing step which removes semiconductor material from the semiconductor chips 11, 21 but substantially does not remove encapsulation material 15. As a result, there is a height difference $d_4$ (or gap or step) between the second faces 13, 23 of the semiconductor chips 11, 21 and the second face 26 of the encapsulation material 15 after the polishing step. Both the second faces 13, 23 of the semiconductor chips 11, 21 and the second face 26 of the encapsulation material 15 may be essentially planar surfaces, which are parallel to each other. In one embodiment, the height difference $d_4$ is in the range from 3 to 10 µm and, in particular, in the range from 3 to 5 µm. The height difference $d_4$ may also be larger, for example, in the range from 3 to 20 µm. The removal of the relief layer 40 and the damaged layer 41 leads the much higher forces to break the semiconductor material of the semiconductor chips 11, 21.

Polishing the second faces 13, 23 of the semiconductor chips 11, 21 may be carried out by any technique that selectively removes the damaged semiconductor material, but substantially does not attack the encapsulation material 15. Examples of such techniques are wet etching and dry etching. Wet etching involves exposing the surface 26 of the encapsulation body 16 to an etch, which etches the semiconductor material and does not etch the encapsulation material 15, such as HF and $HNO_3$ for example. The depth of the cavity produced by the etch in the semiconductor chips 11, 21 can be controlled using the etching time and the known etch rate. Dry etching is often carried out by using a plasma etcher. The plasma etcher produces a plasma from a process gas, for example, a fluorine bearing gas, using a high electric field. The encapsulation body 16 is placed in the plasma etcher, and the air is evacuated from the process chamber using a system of vacuum pumps. Then the process gas is introduced at low pressure and is excited into a plasma through dielectric breakdown. It may, however, be provided that the encapsulation material 15 includes a resin matrix and silicon particles embedded in the resin matrix. During the polishing step the resin matrix is not removed, but those silicon particles are removed together with the semiconductor material of the semiconductor chips 11, 21 that are exposed on the surface of the encapsulation material 15.

FIG. 2N schematically illustrates a back side protect layer 43 which is deposited onto the back side of the encapsulation body 16. The back side protect layer 43 may be made of an appropriate foil which is laminated on the encapsulation body 16 or an appropriate paste which is spread across the back side of the encapsulation body 16 using a squeegee. In one embodiment, the back side protect layer 43 does not reproduce the step in the back side of the encapsulation body 16. Instead, the back side protect layer 43 has a substantially planar surface 44.

FIG. 2O schematically illustrates solder balls 45 that are placed onto the external contact pads 35. The solder material is formed from metal alloys which are composed, for example, from the following materials: SnPb, SnAg, SnAgCu, SnAgCuNi, SnAu, SnCu and SnBi. The solder balls 45 are used to electrically couple the devices 200 to other components, for example, a PCB.

FIG. 2P schematically illustrates that the devices 200 are separated from one another by dicing the encapsulation body 16. Dicing the encapsulation body 16 may, for example, be performed by using sawing, cutting, milling, etching or a laser beam.

The devices 200 manufactured by the method described above are fan-out type packages. The encapsulation material 15 allows the redistribution layer 17 to extend beyond the outline of the semiconductor chips 11, 21. The external contact pads 35 therefore do not need to be arranged within the outline of the semiconductor chips 11, 21, but can be distributed over a larger area. The increased area which is available for arrangement of the external contact pads 35 as a result of the encapsulation body 16 means that the external contact pads 35 cannot only be arranged at a great distance from one another, but that the maximum number of external contact pads 35 which can be arranged there is likewise increased compared to the situation when all the external contact pads 35 are arranged within the outline of the semiconductor chips 11, 21.

It is obvious to a person skilled in the art that the devices 200 shown in FIG. 2P and the manufacturing thereof as described above are only intended to be an exemplary embodiment, and many variations are possible. Each of the devices 200 described above contains a single semiconductor chip. Alternatively, two or more semiconductor chips or passives of different types may be included in the same device 200. The semiconductor chips and passives may differ in function, size, manufacturing technology, etc. Furthermore, the redistribution layer 17 of the devices 200 includes only one layer of conductor tracks. Alternatively, two or more layers of conductor tracks may be provided. These layers may be stacked on top of each other, and dielectric layers may be arranged between adjacent layers of conductor tracks.

FIG. 3 schematically illustrates a device 300 which is similar to the device 200 shown in FIG. 2P. The difference is that, in the device 300, the back side protect layer 43 reproduces the step from the second face 13 of the first semiconductor chip 11 to the encapsulation material 15 surrounding the first semiconductor chip 11. In this embodiment, a foil is laminated onto the encapsulation body 16 to produce the back side protect layer 43.

FIG. 4 schematically illustrates a system 400 which includes the device 200 mounted on a circuit board 50, for example, a PCB. The circuit board 50 has contact pads 51, and the device 200 is soldered to the contact pads 51 by means of solder balls 45.

Figure 5A:
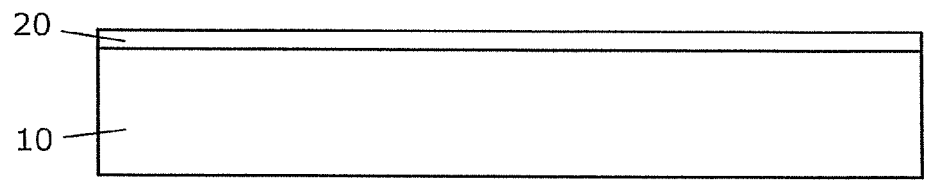
FIGS. 5A-5I schematically illustrate a cross-sectional view of one embodiment of a method of manufacturing a device including producing a fan-out type package of a semiconductor chip including contact elements protruding from the semiconductor chip, grinding the package and producing a step between the package and the semiconductor chip.
Figure 5B:
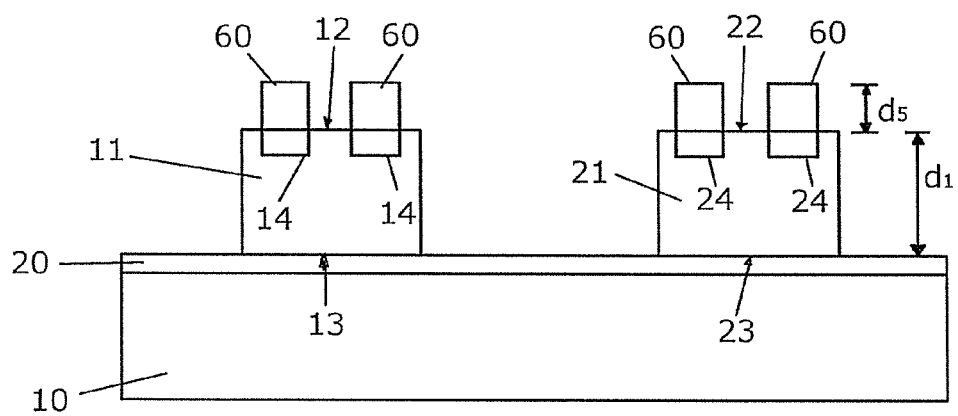
Figure 5C:
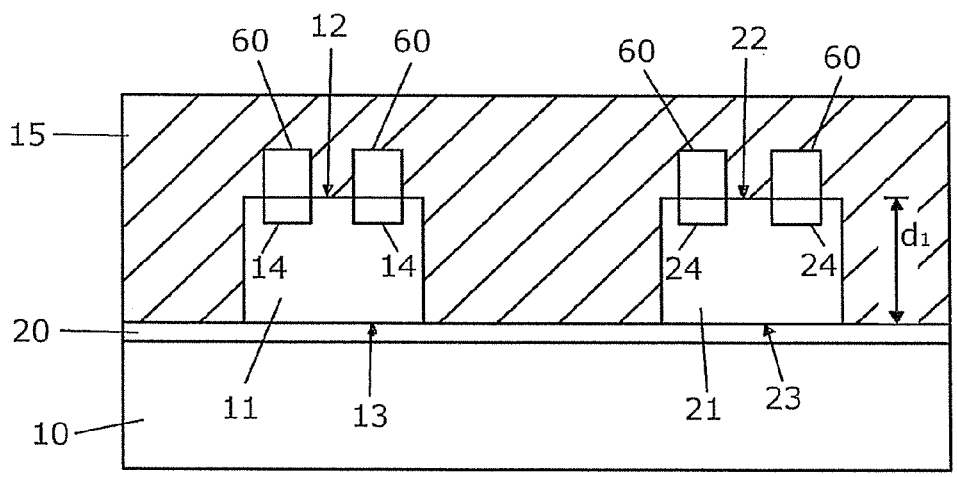
Figure 5D:
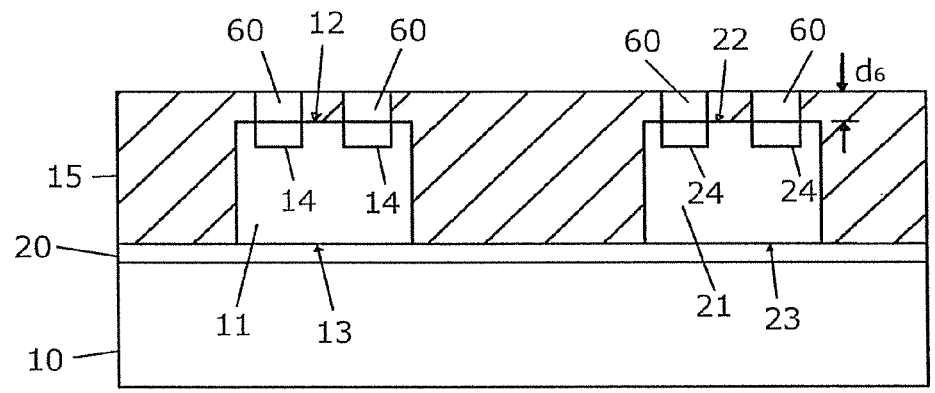
Figure 5E:
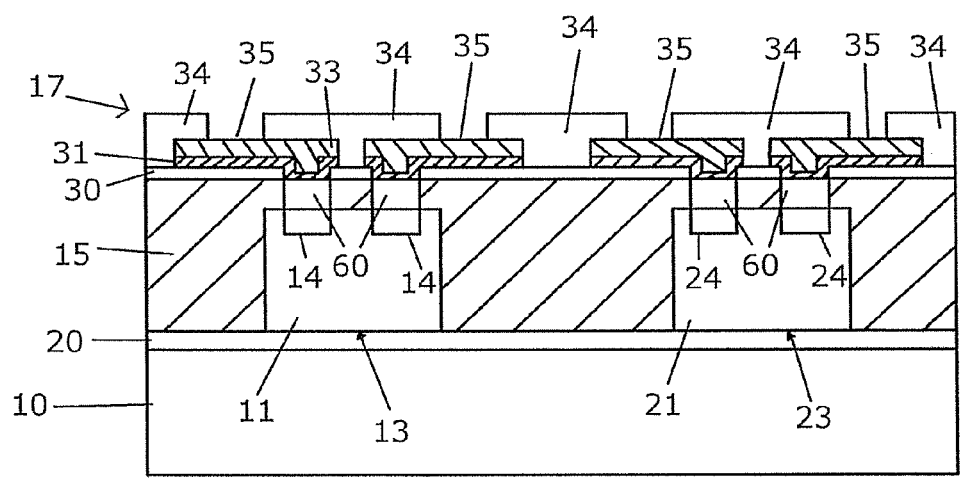
Figure 5F:
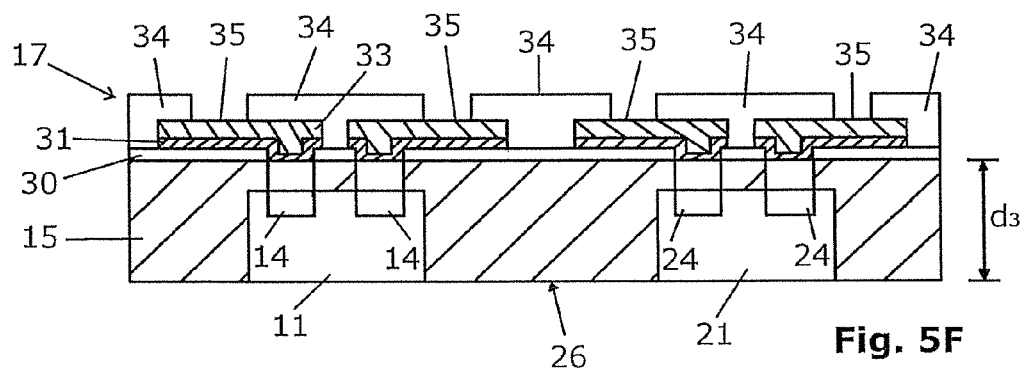
Figure 5G:
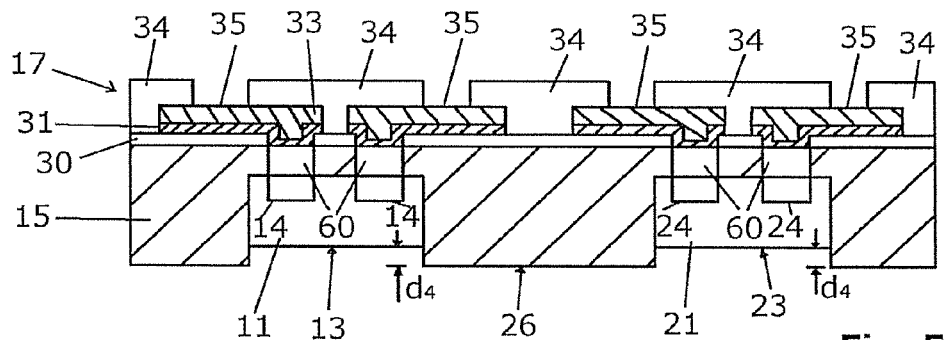
Figure 5H:
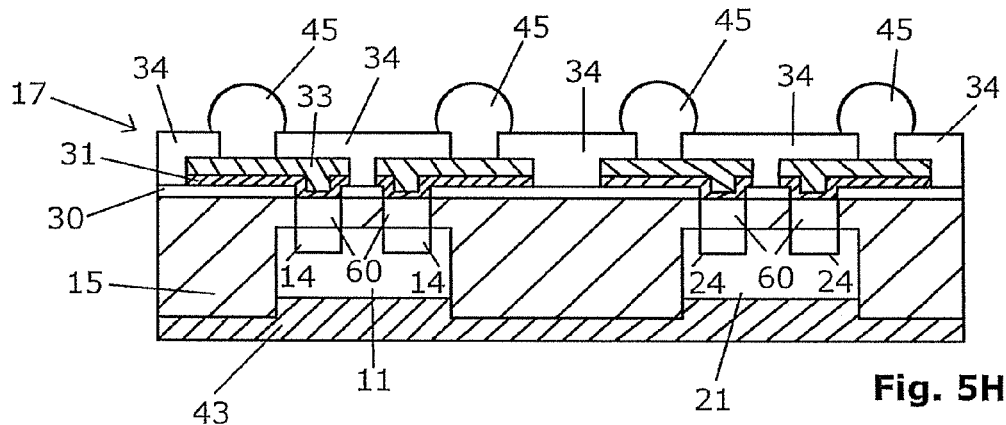
Figure 5I:
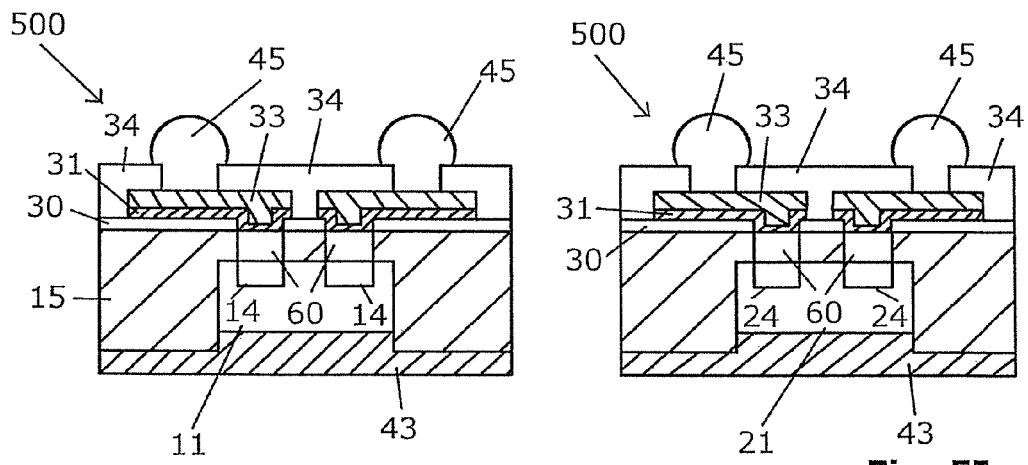

FIGS. 5A-5I schematically illustrate a method for manufacturing a device 500, a cross section of which is shown in FIG. 5I. The method shown in FIGS. 5A-5I is similar to the method shown in FIGS. 2A-2P. Like reference numerals designate corresponding similar parts.

FIG. 5A schematically illustrates the carrier 10 and the adhesive tape 20, which is laminated onto the carrier 10, as described above in connection with FIG. 2A.

FIG. 5B schematically illustrates the semiconductor chips 11 and 21, which are placed on the top face of the adhesive tape 20. In contrast to the embodiment illustrated in FIG. 2B, the second faces 13, 23 of the semiconductor chips 11, 21 face the carrier 10. In addition, contact elements 60 protruding from the contact pads 14, 24 are arranged on the semiconductor chips 11, 21. In one embodiment, the semiconductor chips 11, 21 have a thickness $d_1$ of around 725 or 775 µm, but other thicknesses $d_1$ are also possible.

The contact elements 60 may be composed of any desired electrically conductive material, for example, of a metal such as copper, a metal alloy, a metal stack or an electrically conductive organic material. The contact elements 60 may have a height $d_5$ in the range from 1 to 20 µm protruding from the upper faces 12, 22 of the semiconductor chips 11, 21, but they may be even larger. Any appropriate method may be utilized to produce the contact elements 60, for example, stud bumping, electro-less plating or placing metal pillars.

When stud bumping is used for producing the contact elements 60, the ball bonding process used in conventional wire bonding is modified. In ball bonding, the tip of the bond wire is melted to form a sphere. The wire bonding tool presses this sphere against the contact pad of the semiconductor chip to be connected, applying mechanical force, heat and/or ultrasonic energy to create a metallic connection. The wire bonding tool next extends the wire to the contact pad on the board, substrate or leadframe and makes a "stitch" bond to that pad, finishing by breaking off the bond wire to begin another cycle. For stud bumping, the first ball bond is made on the contact pad of the semiconductor wafer as described, but the wire is then broken close above the ball. The resulting ball or "stud bump" remaining on the contact pad 14, 24 provides a permanent, reliable connection to the underlying electrically conductive material of the contact pad 14, 24.

As an alternative to stud bumping, an electrochemical deposition may be utilized to produce the contact elements 60. For that, a metal layer, for example copper, may be electro-less deposited on the contact pads 14, 24 from a solution. Subsequently other metals, such as nickel and gold, may be electro-less deposited onto the copper layer. Furthermore, other deposition methods, such as sputtering and/or galvanic deposition for example, may also be employed. In the latter cases, however, structuring steps may be necessary.

As a further alternative, pre-fabricated metal pillars (or posts), for example, copper pillars, may be mounted on the contact pads 14, 24 to form the contact elements 60.

FIG. 5C schematically illustrates the encapsulation material 15 which is used to encapsulate the semiconductor chips 11, 21 similar to the embodiment illustrated in FIG. 2C. The encapsulation material 15 covers the first faces 12, 22, the contact elements 60 and all side faces of the semiconductor chips 11, 21.

FIG. 5D schematically illustrates that material is removed from the upper surface of the encapsulation material 15 by grinding. Grinding is carried out until the upper surfaces of the contact elements 60 are exposed from the encapsulation material 15. It is also possible that the heights of the contact elements 60 are reduced during the grinding. After the grinding step, the contact elements 60 may have a height $d_6$ of less than 20 µm, in particular, less than 10 or 5 µm. Further, after the grinding step, the upper surfaces of the contact elements 60 and the upper surface of the encapsulation material 15 define a common plane.

FIG. 5E schematically illustrates the redistribution layer 17 which is deposited on the upper surface of the encapsulation material 15 in the same or a similar way as described above in connection with FIGS. 2F-2K. The redistribution layer 17 is coupled to the exposed portions of the contact elements 60.

FIG. 5F schematically illustrates that the carrier 10 is removed and the encapsulation body 16 is thinned again by grinding the second face 26 of the encapsulation material 15. During the grinding process, encapsulation material 15 and semiconductor material of the semiconductor chips 11, 21 are removed at the same time. The thickness $d_3$ of the semiconductor chips 11, 21 (and the encapsulation material 15) after the grinding depends on the requirements of the application that the devices 500 are designed for. In one embodiment, the thickness $d_3$ of the semiconductor chips 11, 21 is around 450 µm after the grinding, but other thicknesses $d_3$ are also possible.

FIG. 5G schematically illustrates that the second faces 13, 23 of the semiconductor chips 11, 21 are polished as described above in connection with FIG. 2M. During the polishing step semiconductor material is removed from the semiconductor chips 11, 21 without substantially removing encapsulation material 15. As a result, a height difference $d_4$ between the second faces 13, 23 of the semiconductor chips 11, 21 and the second face 26 of the encapsulation material 15 is produced. In one embodiment, the height difference $d_4$ is in the range from 3 to 10 µm and, in particular, in the range from 3 to 5 µm. The height difference $d_4$ may also be larger, for example, in the range from 3 to 20 µm.

FIG. 5H schematically illustrates the back side protect layer 43 deposited onto the second face 26 of the encapsulation material 15 and solder balls 45 placed on the external contact pads 35.

FIG. 5I schematically illustrates that the encapsulation material 15 is diced thereby producing the individual devices 500.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
    a semiconductor chip having a first face and a second face opposite to the first face, wherein a contact pad is arranged within the semiconductor chip at the first face thereof, wherein the contact pad has a contact surface coplanar with the first face of the semiconductor chip and an opposing surface, opposite the contact surface, facing toward the second face of the semiconductor chip, and wherein the contact pad provides an electrical coupling at the contact surface thereof for an element external to the semiconductor chip with an integrated circuit of the semiconductor chip; and an encapsulation material having a first face and a second face opposite to the first face, wherein the encapsulating material encapsulates the semiconductor chip, wherein the first face of the semiconductor chip and the first face of the encapsulation material are co-planar thereby defining a plane, wherein the first face of the semiconductor chip is exposed from the encapsulation material, and wherein the second face of the semiconductor chip is also exposed from the encapsulation material, wherein the second face of the semiconductor chip and the second face of the encapsulation material have a height difference in the range from 3 to 10 μm, and wherein a thickness of the semiconductor chip is smaller than a thickness of the encapsulation material.

2. The device of claim 1, wherein the second face of the semiconductor chip is exposed from the encapsulation material.

3. The device of claim 1, wherein the encapsulation material covers side faces of the semiconductor chip.

4. The device of claim 1, wherein a redistribution layer is arranged on the plane defined by the first face of the semiconductor chip and the first face of the encapsulation material.

5. The device of claim 4, wherein the redistribution layer extends beyond an outline of the semiconductor chip.

6. The device of claim 1, wherein the difference between a thickness of the semiconductor chip and a thickness of the encapsulation material is equal to the height difference between the second face of the semiconductor chip and the second face of the encapsulation material.

7. The device of claim 1, wherein the encapsulation material is homogenous and entirely made of the same material.

* * * * *